(12) United States Patent
Holcombe et al.

(10) Patent No.: US 6,378,757 B1
(45) Date of Patent: Apr. 30, 2002

(54) METHOD FOR EDGE MOUNTING FLEX MEDIA TO A RIGID PC BOARD

(75) Inventors: Brent A. Holcombe, Bellingham, WA (US); Steven D Draving, Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/773,075

(22) Filed: Jan. 31, 2001

(51) Int. Cl.[7] .............................................. B23K 31/02
(52) U.S. Cl. ..................... 228/166; 228/180.22; 29/840
(58) Field of Search ............................. 228/166, 180.1, 228/180.22, 180.21, 254; 29/840, 852; 361/760, 768, 784; 251/693, 690

(56) References Cited

U.S. PATENT DOCUMENTS

| | | | | |
|---|---|---|---|---|
| 5,140,745 A | * | 8/1992 | McKenzie, Jr. | |
| 5,570,505 A | * | 11/1996 | Downie et al. | |
| 6,079,099 A | * | 6/2000 | Uchida et al. | |
| 6,144,090 A | * | 11/2000 | Higashiguchi | |
| 6,262,649 B1 | * | 7/2001 | Roessler et al. | |
| 6,266,107 B1 | * | 7/2001 | Ishii | |

* cited by examiner

*Primary Examiner*—Tom Dunn
*Assistant Examiner*—Jonathan Johnson
(74) *Attorney, Agent, or Firm*—Regan L. Trumper

(57) ABSTRACT

Edge mounting flexible media to a rigid PC board construction can be achieved by various methods. In any method used, there is a desire to create solderable pads on the edge of the rigid PC board. In accordance with the invention, the solderable pads are created by edge plating the PC Board or by a sliced via method. Depending on the type of flexible transmission line used, the construction will differ accordingly. For terminating flexible circuit media, the flex pads are laid out in such a way that the pads are etched in a configuration that matches up with the edge pads on the rigid PC Board. Solder past is then applied to the pads on the flex. The rigid PC Board is fixtured at a right angle to the flex and run through the reflow oven.

9 Claims, 2 Drawing Sheets

METHOD FOR EDGE MOUNTING FLEX MEDIA TO A RIGID PC BOARD

BACKGROUND

Egressing circuitry and other signal transmission media out of a confined space presents several issues. Interposing probes are often used in confined space in connection with target systems designed to probe electronic devices such as microprocessors. One alternative is to egress signals by edge mounting rigid PC boards to each other. Another solution is to laminate flex PCB to rigid PC board material in a multi-layer stack and then punch vias through the flex to connect the various layers. Still another alternative is to use flexible circuit material soldered to rigid PC board material and egress signal out at a right angle with a minimum bend radius. Yet another solution is to terminate a controlled impedance media to a paddle card, which is the connected to a flexible circuit via connector.

These prior alternatives do not generally allow a user to egress flexible circuitry and other signal transmission media out of a confined space at a minimum angle of ninety degrees. Accordingly, use of prior alternatives does not allow the most efficient use of PC board space due to a target board designer's need to allow space for component placement.

In addition, reliability and life of the egression media is sacrificed by the prior alternatives. When flex egress is done at a right angle with a minimum bend radius, it puts stress on the individual traces of flex circuit or the dielectric of individually shielded transmission lines, especially if the user flexes a probe beyond the minimum bend radius.

SUMMARY

The present invention provides for edge mounting to rigid board material allowing egress of flexible circuitry and other signal transmission media out of a confined space at a minimum angle of ninety degrees. This allows target board designers to place components in a much denser configuration. This also gives more flexibility to the board designer and the probe designer. Edge mounting technology allows the designer of a processor probe to egress flexible signal transmission media with minimum real estate utilized on the board.

The present invention also provides for greatly increased reliability and life of flexible media by edge mounting flex and other transmission media. Using edge mounting technology in accordance with the present invention, a minimum bend radius is locked in, relieving the stress on the media that would otherwise be experienced in a flex bend up design. Edge mounting in accordance with the invention provides a built in stress relief for the flexible transmission media. Instead of being required to bend the media at a minimum radius to egress signals from an interstitial array, the solder connections of the media to rigid piece provides a built in stress relief while creating a minimum bend radius egress of the media in the vertical (Z axis) direction.

The present invention also provides for increased signal integrity of probed signals by decreasing the electrical length that each signal must travel. By eliminating the bend radius, the overall length of the flexible portion of the probe can be reduced.

DETAILED DESCRIPTION

The method of the invention provides an edge mounting technology allowing a designer of a processor probe to egress flexible signal transmission media with minimum real estate utilized on the board. Edge mounting technology provides a built in stress relief for the flexible transmission media. Instead of being required to bend the media at a minimum radius to egress signals from an interstitial array, the solder connections provided by the method of the invention of the media to a rigid piece provides a built in stress relief while creating a minimum bend radius egress of the media in the vertical direction. The method of the invention provides many other useful advantages discussed herein.

Edge mounting flexible media to a rigid PC board construction can be achieved by various methods. In any method used, there is a desire to create solderable pads on the edge of the rigid PC board. In accordance with one embodiment of the invention, the solderable pads are created by edge plating the PC Board or by a sliced via method. Depending on the type of flexible transmission line used, the construction will differ accordingly. For terminating flexible circuit media, the flex pads are laid out in such a way that the pads are etched in a configuration that matches up with the edge pads on the rigid PC Board. Solder paste is then applied to the pads on the flex. The rigid PC Board is fixtured at a right angle to the flex and run through the reflow oven. For terminating flexible coax or other shielded transmission line, the pad configuration on the rigid PC Board is done so that there is a row of signal pads separated by a ground termination row of pads. The individual conductors are then attached to the row of signal pads while the grounding shield is attached to the ground pads.

Figure 1A:
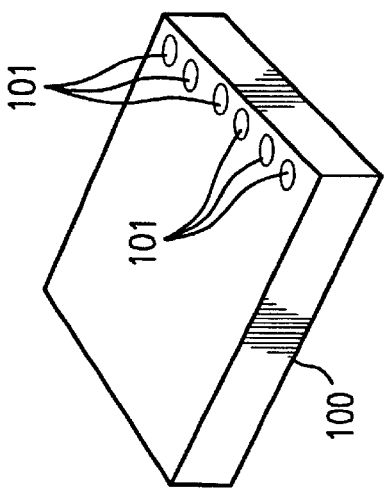
FIGS. 1A–E show a perspective view of a probe assembly during various steps of a preferred embodiment of the method of the invention

FIGS. 1A–E show a perspective view of a probe assembly during various steps of a preferred embodiment of the method of the invention utilizing sliced vias. Referring now to FIG. 1A, a piece of rigid material 100 is shown. Preferably, the rigid material 100 is a rigid PC Board approximately 0.062 inches in thickness. A plurality of vias 101 are drilled through the rigid material. Preferably, the plurality of vias 101 are of equal diameter and equal spacing from one another. The center of each of the plurality of vias lies in the same plane.

Figure 1B:
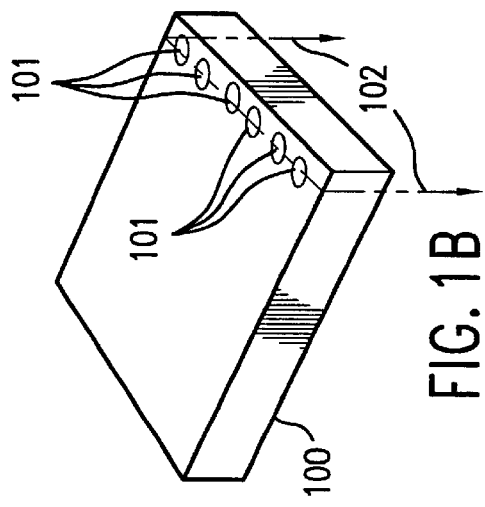

FIG. 1B shows the rigid material 100 with a plurality of vias 101 drilled therethrough. In accordance with the invention, a centerline 102 corresponding to the center of the plurality of vias 101 is determined. The centerline 102 can be physically drawn or marked on the rigid material 100 or otherwise remembered. The plurality of vias 101 are then plated and filled with solder. Preferably, the solder filling is eutectic solder and is placed in the plurality of vias 101 using a dip or wave soldering method.

Figure 1C:
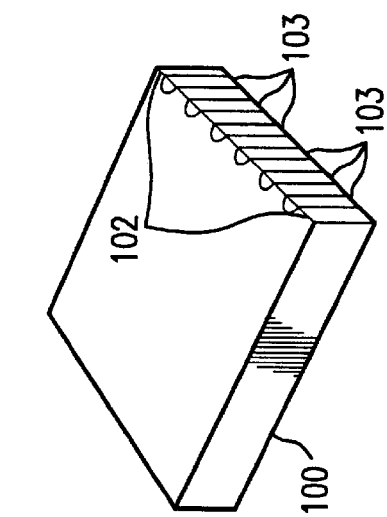

FIG. 1C shows the rigid material 100 having been sliced through centerline 102. The rigid material 100 can have been sliced by running a router down the centerline 102 of the plurality of vias 101. A plurality of edge pads 103 results from slicing the rigid material 100. Each of the plurality of edge pads 103 comprises the solder material used to fill the vias 101. It is understood that the invention is not limited to a plurality of edge pads comprised of two rows of pads as shown in the figures. The figures are merely illustrative of one embodiment of the invention. Depending on the requirements of an end user, a matrix of edge pads is possible comprising a multitude of rows.

In an alternative embodiment of the invention (not shown in the figures), a plurality of edge pads on the rigid media are created by edge plating the rigid media and milling the plating. In this embodiment, a rigid media is plated at one edge with a suitably conductive material. The plating is then milled to form a matrix of edge pads. It is again understood, that the matrix of edge pads possibly comprises a multitude of rows and columns of pads.

Figure 1D:
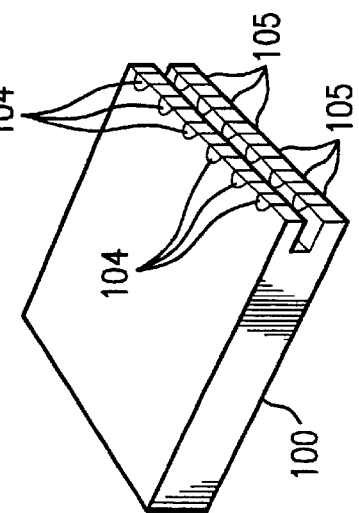

FIG. 1D shows the rigid material 100 with a plurality of upper edge pads 104 and a plurality of lower edge pads 105. The upper edge pads 104 and lower edge pads 105 are created by slicing horizontally through the center of the full size edge pads 103. The horizontal slicing can be performed with a router. The upper and lower edge pads 104,105 are upper and lower signal layers.

Figure 1E:
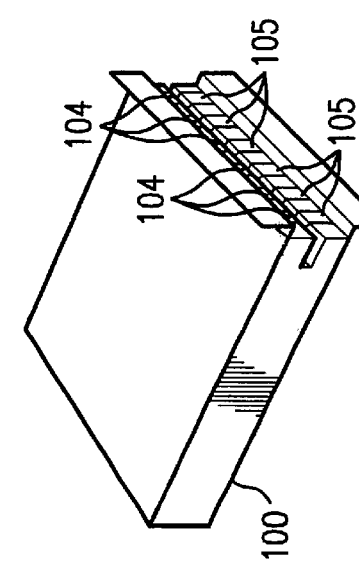
Figure 1E:
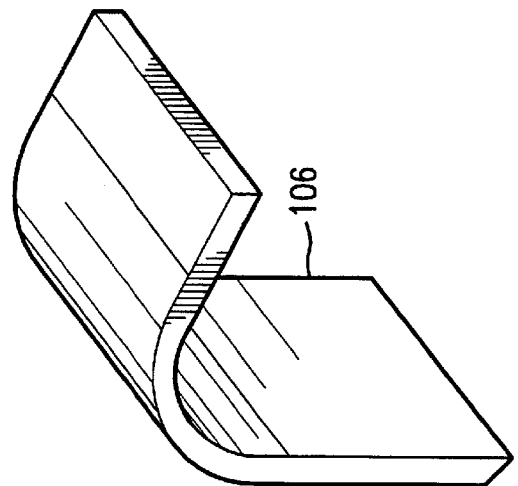

FIG. 1E shows an exploded view of a rigid material 100 and a flexible circuit 106. A plurality of solder pads 107 matching the pattern of the upper and lower edge pads 104,105 are on the side of the flexible circuit hidden from view. A fillet 108 of RTV silicon or equivalent material is placed along the top and bottom interface of the rigid material 100. The fillets 108 act as a stress relief for the solder joints. The flexible circuit 106 is matched to the upper and lower edge pads 104,105 and heated. An electrical connection is thereby created between the rigid material 100 and the flexible circuit 106. The rigid material 100 and flexible media 106 are soldered together using reflow or other method sufficient to solder the flexible media 106 to the rigid material 100.

Figure 2:
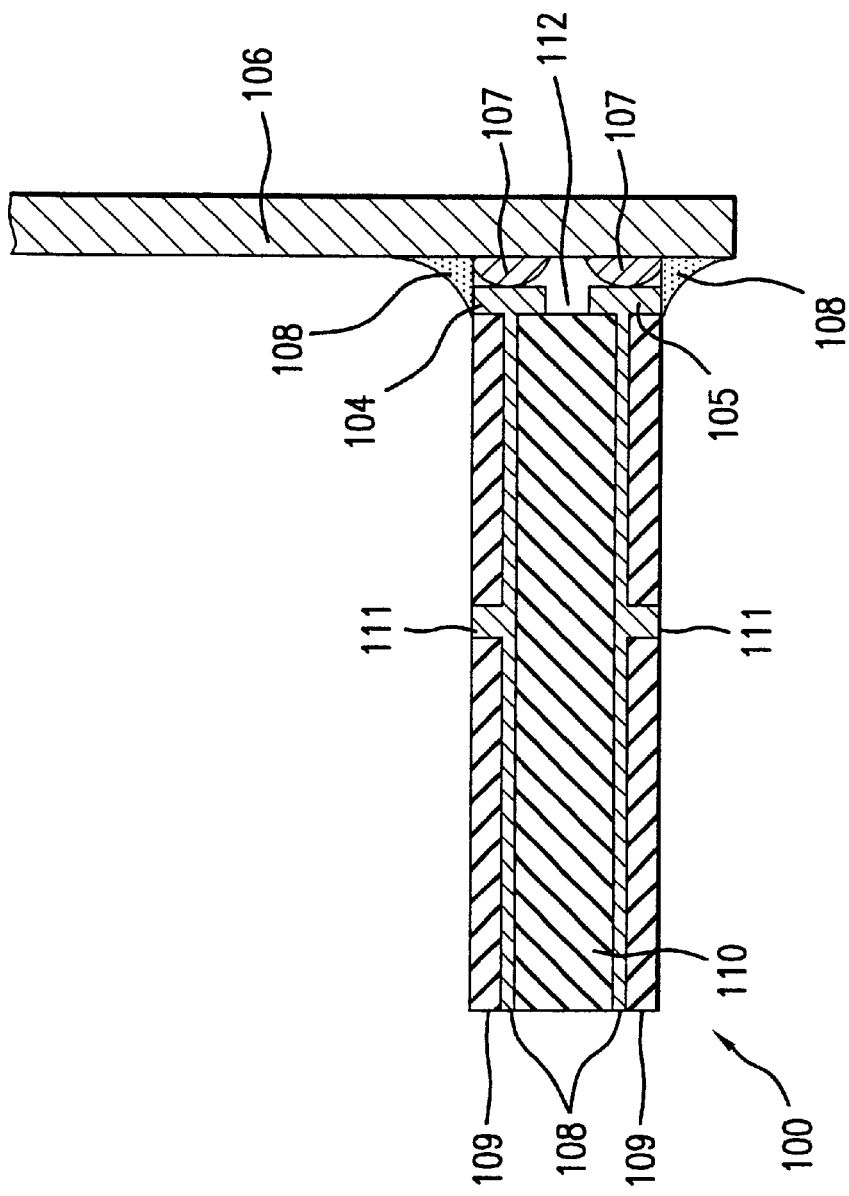
FIG. 2 shows a side view of a rigid-flex assembly constructed in accordance with the method of the invention.

FIG. 2 shows a side view of a rigid-flex assembly constructed in accordance with the method of the invention. The rigid material 100 comprises a pair of signal layers 108, rigid outer material 109 and an intermediate layer 110. In one embodiment of the invention, the rigid outer material 109 and intermediate layer are comprised of an FR-4. It is recognized that a multitude of types of intermediate layers exist. A plurality of vias 111 protrudes through the rigid material 100. Upper and lower edge pads 104,105 are at one end of the rigid material 100 and are separated by a space 112 created by horizontally slicing through the plurality of edge pads 103. Flexible circuit 106 is soldered to the rigid material 100 via solder pads 107 matched to the upper and lower edge pads 104,105. Two fillets 108 are connected in place to relieve stress on the flexible media 106. The flexible media 106 can be any controlled impedance media, including but not limited to, flexible circuitry, shielded coax and flexible-but not shielded circuitry.

While the present invention has been illustrated and described in connection with the preferred embodiment, it is not to be limited to the particular structure or steps shown. The foregoing description of the present invention has been presented for the purposes of illustration and description only. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A method of edge mounting a flexible media to a rigid media comprising the steps of:

drilling a plurality of vias through said rigid media, said plurality of vias being aligned in a row with the center of the vias forming a centerline;

filling said plurality of vias with solder;

slicing through said rigid material down the centerline of said plurality of vias forming a plurality of edge pads;

cutting a slot through the rigid material, said slot running perpendicular to said plurality of edge pads and forming a plurality of upper edge pads and lower edge pads;

soldering a flexible media to said rigid material, wherein said flexible media has a plurality of solder pads to match said plurality of upper and lower edge pads; and connecting a fillet to said rigid material and to said flexible media.

2. The method of claim 1, wherein said rigid material is a printed circuit board.

3. The method of claim 2, wherein said flexible media comprises a plurality of traces electrically connecting said flexible media to said rigid material.

4. The method of claim 3, wherein said plurality of traces on said flexible media are controlled impedance transmission lines.

5. The method of claim 4, wherein said flexible media is a flexible circuit.

6. The method of claim 4, wherein said flexible circuit is an unshielded flexible circuit.

7. The method of claim 4, wherein said flexible circuit is a shielded flexible circuit.

8. The method of claim 3, wherein said controlled impedance media is a shielded coax media.

9. The method of claim 2, wherein said step of soldering said flexible media to said rigid material forms an electrical connection between the printed circuit board and flexible media.

* * * * *